United States Patent [19]

Piotrowski

[11] Patent Number: 4,665,425

[45] Date of Patent: May 12, 1987

[54] FABRICATION OF VERTICAL NPN AND PNP BIPOLAR TRANSISTORS IN MONOLITHIC SUBSTRATE

[75] Inventor: Leo R. Piotrowski, Indian Harbour Beach, Fla.

[73] Assignee: Harris Corporation, Melbourne, Fla.

[21] Appl. No.: 787,927

[22] Filed: Oct. 16, 1985

[51] Int. Cl.⁴ ............................................. H01L 27/12
[52] U.S. Cl. ...................................... 357/49; 357/44; 357/50; 357/51; 357/34
[58] Field of Search .................... 357/44, 49, 50, 51, 357/34

[56] References Cited

U.S. PATENT DOCUMENTS 4,299,024 11/1981 Piotrowski ............................ 357/44
4,536,784 8/1985 Nagumo et al. ...................... 357/51
4,546,539 10/1985 Beasom ................................ 357/44

*Primary Examiner*—Edward J. Wojciechowicz
*Attorney, Agent, or Firm*—Antonelli, Terry & Wands

[57] ABSTRACT

Vertical PNP and the NPN transistors, each having a gain-bandwidth product greater than 1 GHz are formed in dielectrically isolated regions in a polysilicon substrate. The substrate may include additional dielectrically isolated regions for other devices such as thin oxide capacitors. On one surface of the substrate between the respective device regions a thick field insulator (oxide) layer is formed to minimize parasitics between interconnects and the substrate. Atop this thick field oxide one or more thin film resistors may be formed. Contacts and interconnect metallization for the bipolar devices, capacitors and thin film resistors are preferably made of silicon-doped-aluminum. In the course of manufacture of the PNP and NPN devices like conductivity type regions are formed simultaneously so as to control the parameters of each device. The relatively high $f_T$ of each device is achieved by reducing the time delays associated with the devices, through precise control of the parameters of impurity introduction (ion implantation and diffusion steps), so as to obtain narrow base widths (thereby reducing the base transit times), narrow and shallow emitters (for reduced emitter delay and base resistance), and shallow bases and a low resistivity substrate (for reduced device size (high integration density) and collector delay). To minimize the incidence of emitter leakage "pipes", which typically occur in shallow bipolar devices, controlled anneal and oxygen gettering steps are carried out and emitter sheet resistance is optimized. Preferably base contacts are formed by dual, narrow stripe diffusions on opposite sides of a narrow emitter stripe.

10 Claims, 9 Drawing Figures

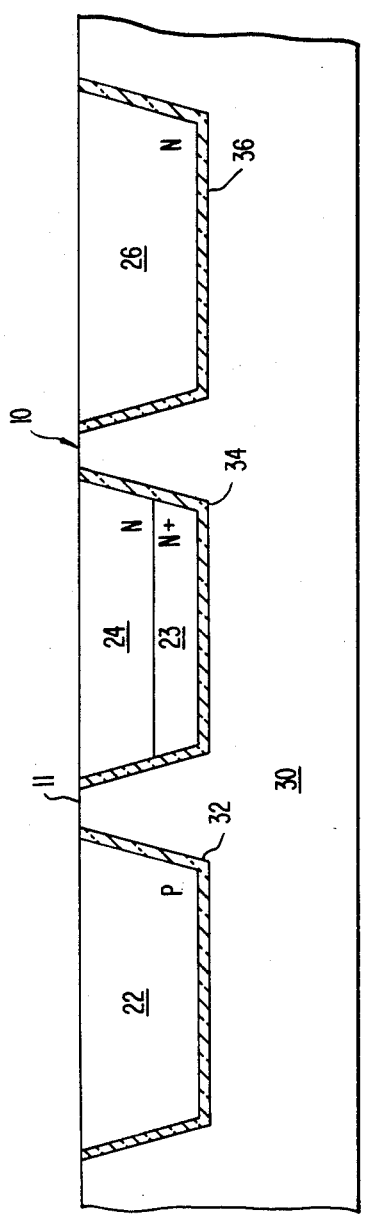
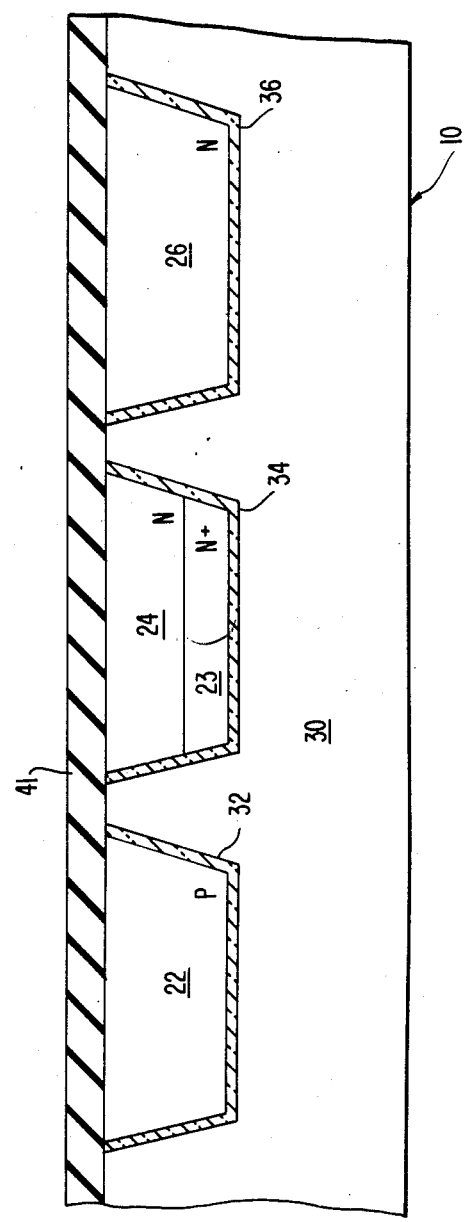
FIG. 1.
FIG. 2.

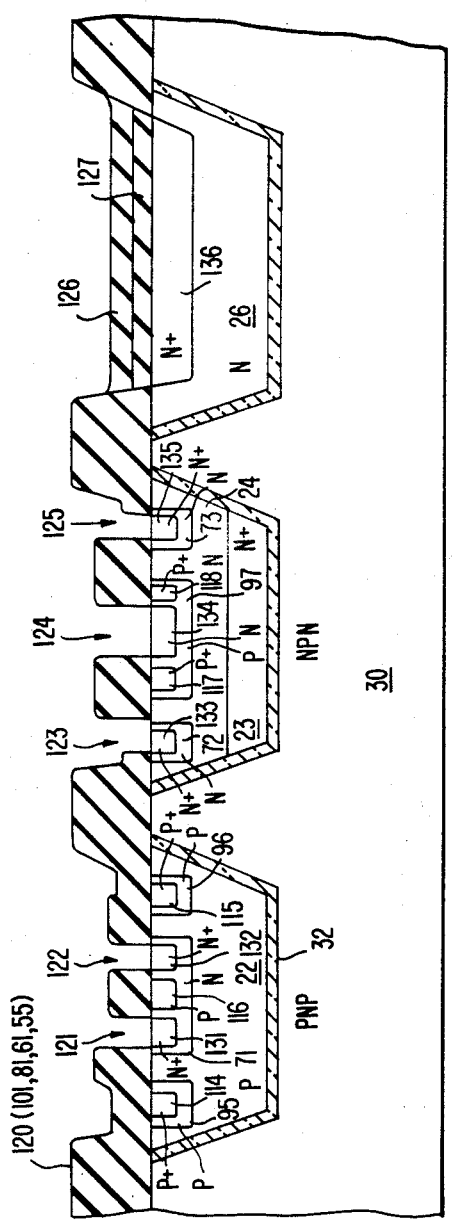
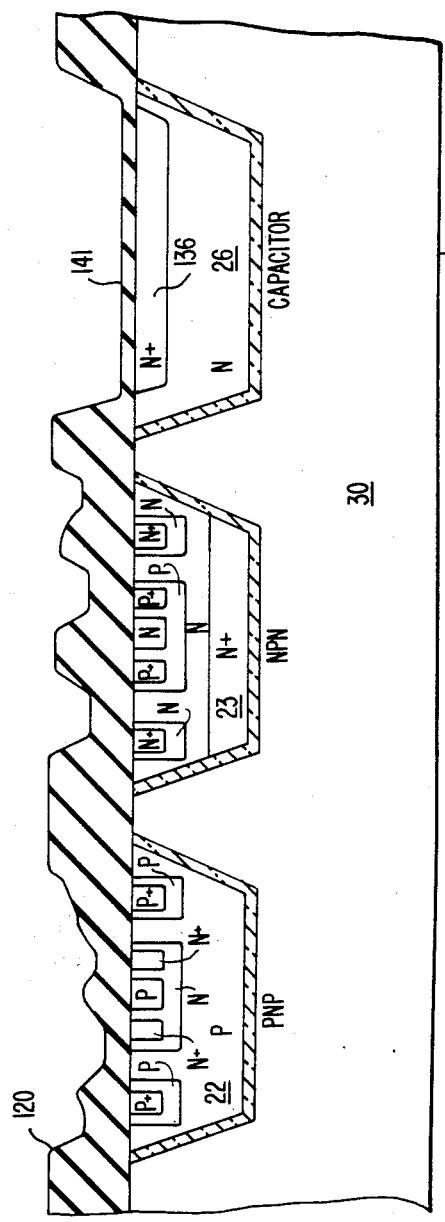
FIG. 7.
FIG. 8.

FABRICATION OF VERTICAL NPN AND PNP BIPOLAR TRANSISTORS IN MONOLITHIC SUBSTRATE

FIELD OF THE INVENTION

The present invention relates to the manufacture of semiconductor devices and, more particularly, to the fabrication of vertical NPN and PNP bipolar transistors, having a gain bandwidth product equal to or greater than 1 GHz, in a monolithic substrate.

BACKGROUND OF THE INVENTION

Discrete NPN and PNP components have been fabricated with an $f_T \geq 1$ GHz. For very high gain-bandwidth product applications (i.e. an $f_T$ greater than or equal to 1 GHz), bipolar (vertical) transistors fabricated in a silicon substate in monolithic form, have been fabricated only as NPN devices with (or without) PNP transistors having been configured either as lateral transistors or substrate type devices, and having a low $f_T$ (1–50 MHz) due to wide base width and inherent parasitics. These performance limitations of PNP devices have placed design constraints on circuit engineers who, faced with demands for increased circuit speed and integration density, look to semiconductor architectures that provide multi-element/multi-function capability, including the availability of both NPN and PNP vertical devices that have comparable very high gain-bandwidth products.

SUMMARY OF THE INVENTION

In accordance with the present invention, there is provided a new and improved bipolar processing methodology through which both NPN and PNP vertical devices, having an $f_T$ equal to or above 1 GHz, may be fabricated in the same semiconductor chip. Pursuant to the inventive process the PNP and the NPN devices are formed in dielectrically isolated regions in a polysilicon substrate. The substrate may include additional dielectrically isolated regions for other devices such as thin oxide capacitors. On one surface of the substrate between the respective device regions a thick field insulator (oxide) layer is formed to minimize parasitics between interconnects and the substrate. Atop this thick field oxide one or more thin film (e.g. nichrome) resistors may be formed. Contacts and interconnect metallization for the bipolar devices, capacitors and thin film resistors are preferably made of silicon-doped-aluminum.

In the course of manufacture of the PNP and NPN devices like conductivity type regions are formed simultaneously so as to control the parameters of each device. The relatively high $f_T$ of each device is achieved by reducing the time delays associated with the devices, through precise control of the parameters of impurity introduction (ion implantation and diffusion steps), so as to obtain narrow base widths (thereby reducing the base transit times), narrow emitters (for reduced base resistance) and shallow emitters (for reduced emitter delay), and shallow bases and a low resistivity substrate (for reduced device size (high integration density) and collector delay). To minimize the incidence of emitter leakage "pipes", which typically occur in shallow bipolar devices, controlled anneal and oxygen gettering steps are carried out and emitter sheet resistance is optimized. Preferably base contacts are formed by dual, narrow stripe (6 μm) diffusions on opposite sides of a narrow emitter stripe.

BRIEF DESCRIPTION OF THE DRAWINGS

FIGS. 1–9 are diagrammatic cross-sectional illustrations of vertical NPN and PNP transistors in a monolithic substrate at respective stages of their fabrication.

DETAILED DESCRIPTION

Figures 3, 4:
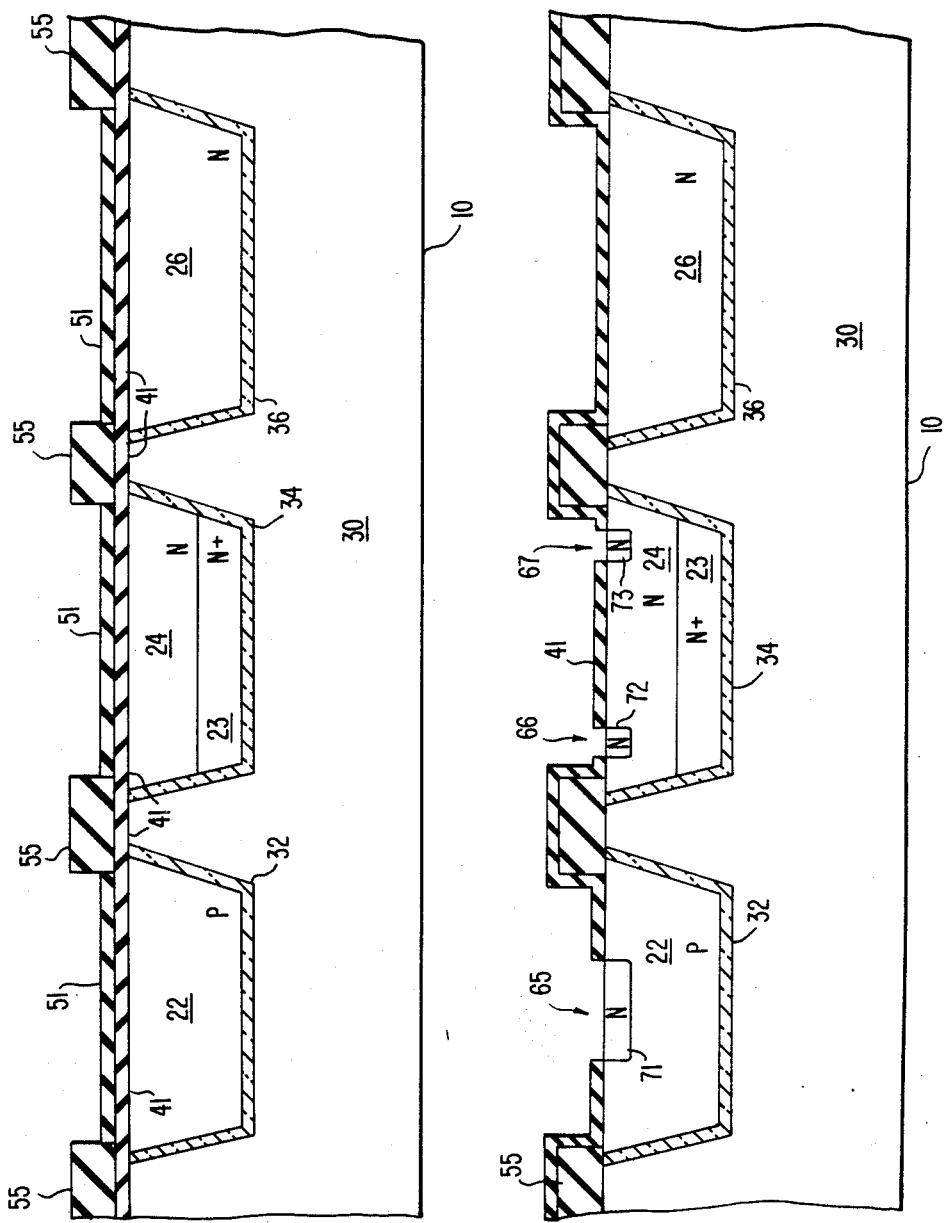

Referring now to FIG. 1, there is shown a polycrystalline silicon substrate 10 containing dielectric (oxide) isolated monocrystalline P and N conductivity type surface island regions 22, 24, 26 in which respective vertical PNP and NPN transistors and other devices, such as capacitors, are to be formed.

Formation of the dielectrically isolated regions 22, 24, 26 begins with the oxidation of a cleaned surface of a suitable monocrystalline N-type substrate, such as N-type, <100> single crystal silicon, having a resistivity of 1–1.5 Ωcm, thereby producing a layer of silicon dioxide having a thickness on the order of 5,000 angstroms on the silicon surface. The silicon dioxide layer is then selectively patterned by a conventional photoresist and etch process to expose those surface portions of the silicon wherein the P collector regions of the vertical PNP transistors (such as region 22) are to be formed. A suitable P-type impurity such as boron is then introduced into the exposed surface portions of the silicon, as by implanting boron ions at an implant energy of 100 KeV and at a dosage of $1.3 \times 10^{14}$ ions/cm$^2$, followed by diffusing the implanted ions to a depth at least equal to the maximum final thickness of the dielectric island regions (17.5 μm in the present example) to thereby form a P-type surface region 22. The resulting sheet resistance in P region 22 lies in a range of 180–260 ohms per square and is preferably targeted at a value on the order of 230 ohms per square, so as to provide low $R_{CS}$ and adequate $BV_{CBO}$ for the PNP transistor to be formed in region 22. The implant and diffusion parameters can vary even more depending on $R_{CS}$ and $BV_{CBO}$ requirements of the PNP transistor. Also, the resistivity range of the N-type substrate can be varied to meet NPN device requirements, e.g. within a range of 0.5–4 Ωcm.

After formation of the P region 22, a new masking layer is formed over the substrate surface and an implant window, exposing a surface portion of the original N-type silicon adjacent to, but spaced apart from, the P region 22 is formed in the masking layer by a conventional photoresist and etch process, to delineate the collector area of the NPN transistor. A suitable N-type impurity is then introduced into the exposed surface of silicon substrate 10, as by implanting phosphorus ions at an implant energy of 100 KeV, and at a dosage of $1 \times 10^{15}$ ions/cm$^2$, followed by diffusing the implanted phosphorus ions for a period of three hours, at 1,250° C., to form an N+ surface region 23 (to become an N+ subcollector region of the NPN transistor) having a thickness on the order of 10 μm and a low sheet resistance on the order of 20–40 ohms per square. The thickness of region 23 can vary depending upon the desired dielectric isolation island thickness so as to maintain a spacing of approximately 5–7 μm to the bottom of the P− base diffusion. (During the phosphorus diffusion, a silicon dioxide layer is grown over the surface of the substrate.) The oxide is then selectively patterned to expose surface portions of the N-type substrate between and including portions of the PNP collector region 22, the NPN subcollector region 23 and an N type capacitor region 26. The resulting structure is then exposed to an ambient which etches silicon but not silicon dioxide. This isotropic step produces V-shaped grooves in the silicon between each of the delineated device regions 22, 24, 26. The masking oxide is then removed (through an HF strip) and the entire exposed surface of the substrate is then oxidized to form dielectric (oxide) isolation regions 32, 34, 36 for the monocrystalline P and N surface regions. These dielectric isolation oxide regions may have a thickness on the order of 2 μm. The thickness can be considerably greater than 2 μm if high pressure oxidation at low temperature, for faster growth rate, is used to minimize N+ diffusion of region 23 during this step.

The monocrystalline wafer is next placed in an epitaxial reactor wherein polycrystalline silicon 30 is deposited on the oxidized surface of the wafer to form the substrate 10. Then the reverse side of the wafer is lapped and polished until the polishing plane 11 reaches the etched oxide isolation pattern. This results in the substrate configuration shown in FIG. 1, wherein N-type regions 26 and 24, including buried N+ subcollector region 23, are dielectrically isolated from each other and from P-type region 22, with each region having a depth on the order of 17.5 μm from the polished surface 11 of the substrate, as noted above.

Next, as shown in FIG. 2, the polished surface 11 of substrate 10 is exposed to a steam ambient at 1,200° C. to form a silicon dioxide layer 41 having a thickness on the order of 5,000-6,000 Å. The oxidized substrate is then annealed at a temperature of 1,200° C. in a nitrogen atmosphere for six hours. This anneal treatment serves to both shrink any existing linear defects in the monocrystalline (N and P) regions and to outdiffuse oxygen from the surface of the same regions, thereby avoiding precipitation and the generation of defects in the device areas 22, 24, 26 during subsequent processing. Following this anneal treatment the substrate is exposed to an ambient of trichlorethane at a temperature of 1,200° C. in an $N_2/O_2$ carrier, to provide a 5% (volume) chlorine flow for a preferred period of 60 minutes, which effectively ties up oxygen in the substrate and thereby reduces defects that contribute to emitter (pipe) leakage. Where the trichlorethane treatment is carried out for a period considerably less than the 60 minute interval described above, there is little effect on defect reduction; a treatment time considerably longer than 60 minutes should be avoided as surface damage is produced.

Upon completion of the defect reduction steps, a thick field oxide is selectively formed. Formation of the field oxide is accomplished by depositing a uniform layer of silicon nitride (preferably 1,500 Å thickness) on the thin oxide surface, followed by photoresist deposit, pattern exposure, development and etch steps, to leave a patterned layer 51 of silicon nitride covering those surface areas of thin oxide surface 41 whereon the thick field oxide is not to be grown. If the thickness of the nitride layer is considerably less than the preferred value of 1,500 Å, a thicker oxide may grow under the nitride layer. On the other hand, the thickness may be considerably greater than 1,500 Å if desired. As shown in FIG. 3, these areas include the dielectrically isolated moncrystalline regions 22, 24, 26 wherein the vertical NPN and PNP transistors and capacitor elements are to be formed. In effect the thick field oxide is selectively formed on those portions of surface 41 between the dielectric isolation regions, i.e. over the polycrystalline material 30 of the substrate 10. This thick field oxide serves to reduce the capacitance between interconnects that overlie the field oxide and the substrate 10.

After the silicon nitride layer 51 has been patterned, the substrate is placed in a steam ambient at 1,100° C. for six hours, resulting in the growth of a layer of silicon dioxide 55 having a thickness on the order of 1.7 μm. The thickness of silicon dioxide layer 55 may be considerably greater than 1.7 μm if layer 55 is grown using high pressure oxidation at low temperature, for a faster growth rate. In the course of hydrofluoric acid dips to be subsequently carried out, the thickness field oxide layer 55 is reduced slightly to approximately 1.6 μm. After the thick field oxide layer 55 has been formed, the silicon nitride layer 51 is stripped off, exposing the regions 22, 24, 26, wherein the transistor and capacitor elements are to be fabricated.

Following removal of the silicon nitride layer 51 leaving the patterned field oxide layer 55, a thin ion implant masking oxide film (on the order of 0.5 μm thickness) 41 remains over the regions 22, 24, 26 (and also in the field oxide 55). As shown in FIG. 4, this implant masking oxide film 41 is then selectively patterned to expose surface portion 65 in P region 22, wherein the base region of the vertical PNP transistor is to be formed, and surface portions 66, 67 in N region 24, wherein collector contact areas for the NPN transistor are to be formed. N conductivity type impurities are then introduced into surface portions 65, 66 and 67 by, for example, implanting phosphorus ions at an implant energy of 40 KeV at a dopant concentration of $1.2 \times 10^{14}$ ions/cm$^2$. These base and collector contact implants are followed by a diffusion operation to form shallow N base region 71 for the PNP device in P region 22 and N regions 72 and 73 for the NPN device in region 24, each region having a depth on the order of less than 1.4 μm. The diffusion operation is initiated at 950° C. in a low oxygen environment for 20 minutes, followed by a steam ambient for 20 minutes. The temperature is then ramped to 1,100° C., and the substrate exposed to a nitrogen atmosphere for 30 minutes. This is followed by down-ramping the temperature to 950° and exposing the substrate to a steam ambient for 50 minutes. Finally, the substrate is exposed to a nitrogen atmosphere for 10 minutes. As a result of this post implant diffusion treatment, the material of the N base region 71 of the PNP device is effectively defect free and has a sheet resistance in a range of from 200 to 300 ohms per square, with a preferred range of 240-270 ohms per square and a target value on the order of 250 ohms per square.

Figures 5, 6:
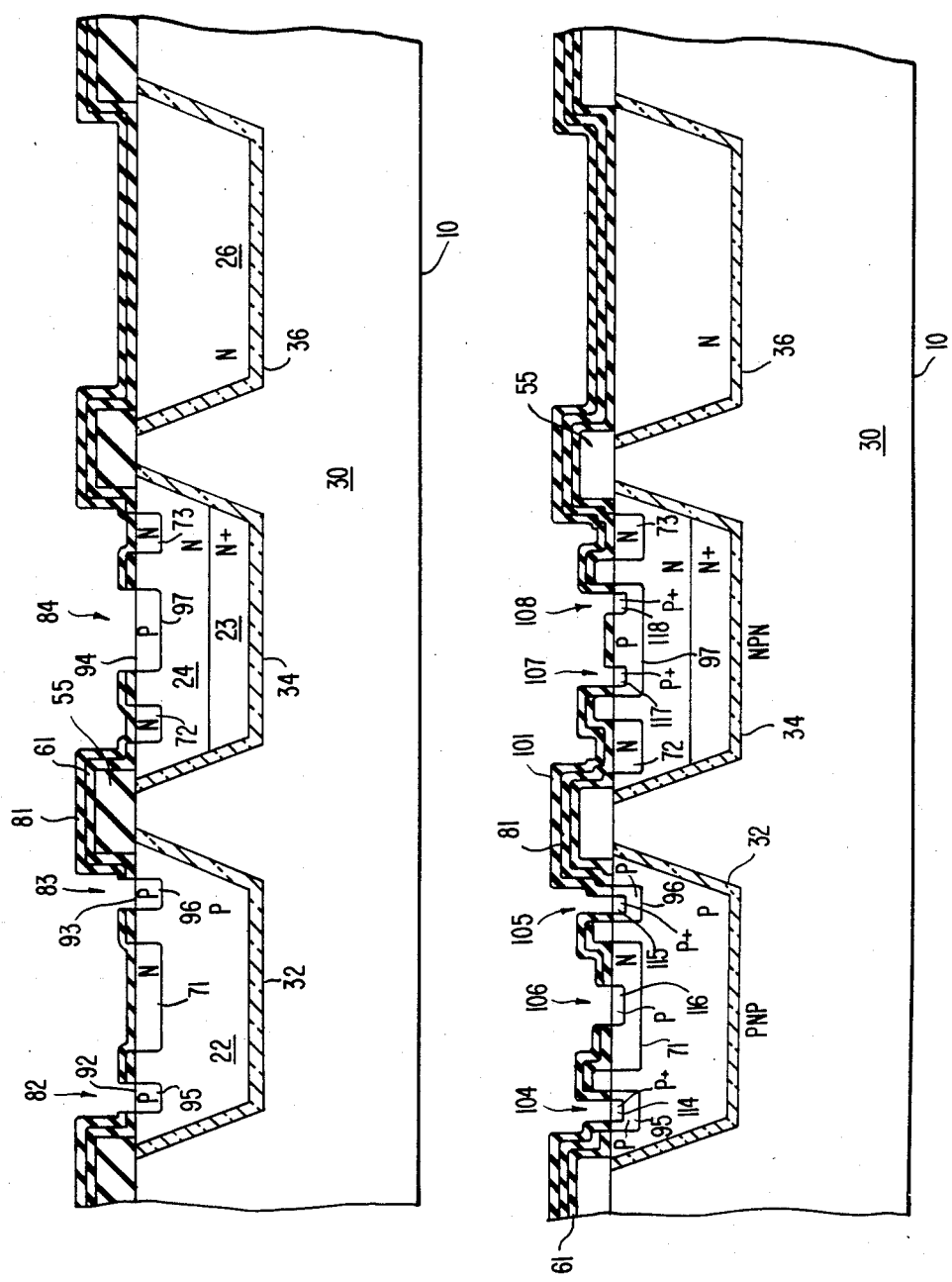
Figure 9:
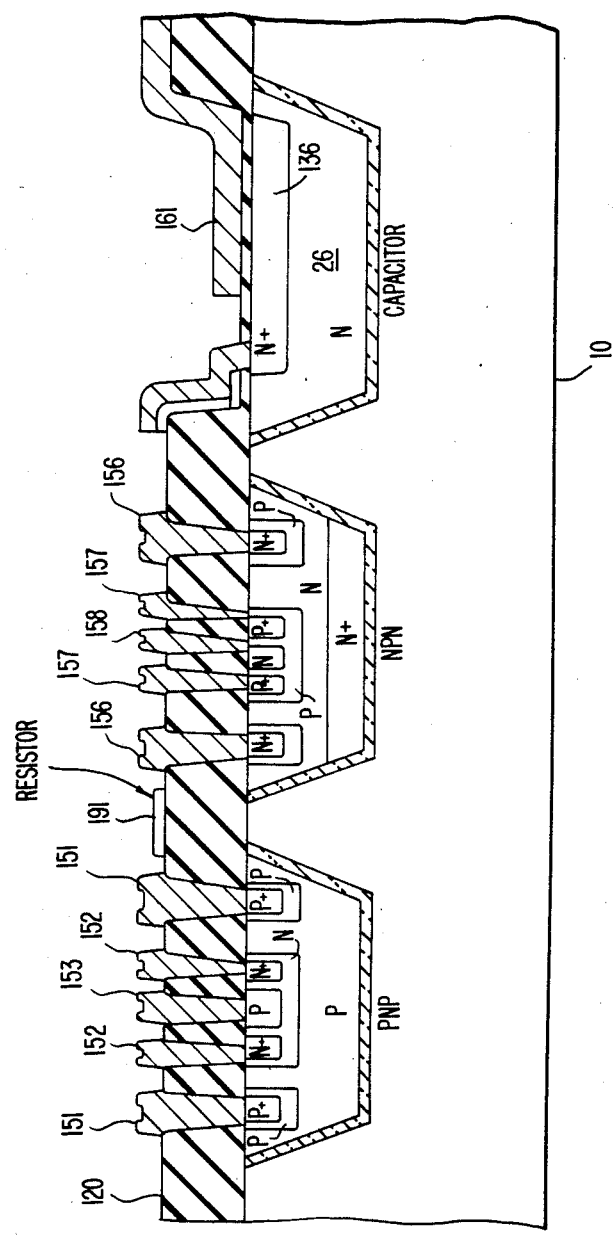

After completion of the PNP base, NPN collector area diffusion/heat treatment, a thin implant masking layer remains on regions 22 and 24 for delineating the P base region of the NPN device and the P collector contact areas for the PNP device. For this purpose, a thin oxide layer 81 (0.6 μm) remains on the surface of the substrate and windows 82, 83 and 84 are photolithographically patterned in masking oxide 81 to expose a pair of spaced apart collector contact surface areas 92, 93 of P region 22 and a base region surface area 94 in N region 24, as shown in FIG. 5. A suitable P-type conductivity impurity is then introduced into the exposed surface areas 92, 93 and 94, as by implanting boron ions at an implant energy of 40 KeV, at a dopant concentration of $3.7 \times 10^{14}$ ions/cm$^2$. This P-type implant is followed by a diffusion operation to form shallow P regions 95, 96 for the collector contact areas of the PNP device in P region 22 and a shallow P-base region 97 for the NPN device in N region 24. (In the present example the depth to which shallow regions 95, 96 and 97 are formed is on the order of one$\mu$m.)

The diffusion heat treatment operation is similar to that carried out for the PNP base region described above. The substrate is initially exposed to a low oxygen ambient for 20 minutes at 950° C., followed by a steam ambient for 20 minutes. The temperature is then up-ramped to 1,100° C. and the ambient changed to nitrogen for 40 minutes. The temperature is then down-ramped to 950° and the atmosphere changed to steam for 85 minutes followed by nitrogen for 10 minutes. This diffusion/heat treatment processing produces a low defect P-base region 97 for the NPN device having a sheet resistance in a range of from 300 to 400 ohms per square, with a preferred range 320–380 ohms per square and a target value on the order of 350 ohms per square.

After formation of the base and collector contact areas of the respective PNP and NPN transistors, shown in FIG. 5, the emitter region and collector contact regions of the PNP device and the base contact regions of the NPN device are formed. For this purpose a thin masking oxide film 101 (thickness 0.7 $\mu$m) remains over P region 22 and N region 24, and windows 104, 105, 106 for the PNP collector contact and emitter regions and windows 107, 108 for the base contact regions of the NPN device are selectively etched in oxide film 101. As shown in FIG. 6, boron is then implanted, at an implant energy of 40 KeV and a dopant concentration of $4.5 \times 10^{15}$ ions/cm$^2$, through windows 104–108, followed by a diffusion/heat treatment for setting $H_{FE}$ and $BV_{CEO}$ of the PNP transistor. For an $H_{FE}$ of 15–20 and $BV_{CEO}$ 30$\geq$volts, the boron implant is diffused at a temperature of 1,000° C. for 10 minutes in an oxygen atmosphere, followed by a steam ambient for 20 minutes and, finally, a nitrogen atmosphere for 15 minutes. With respect to the HFE value of 15–20 (and sheet resistance of 40–50 ohms per square) the HFE target value will depend upon the final HFE desired and $BV_{CEO}$. While a preferred temperature is the 1000° C. value, it can range from 950° C. to 1050° C. depending on the control desired and HFE target value. As a result of this implant and diffusion treatment the PNP transistor contains a pair of P+ collector contact regions 114 and 115 formed in preliminary P collector contact areas 95 and 96 and a shallow P-emitter region 116 formed in N base region 71; also, the NPN transistor contains a pair of P+ base contact regions 117 and 118 formed in P base region 97. The depth of each of shallow P regions 114–118 may be on the order of 0.9 $\mu$m.

Following formation of the emitter and collector contact regions of the PNP device, and the pair of base contact regions of the NPN device, the emitter and collector contact regions of the NPN device, a pair of base contact regions of the PNP device and capacitor bottom plate are formed. For this purpose, as shown in FIG. 7, a thin masking oxide layer 120 (thickness 0.7 $\mu$m) remains over regions 22, 24 and 26, oxide layer 120 having windows 121, 122 exposing respective surface portions of N base region 71 on opposite sides of emitter region 116 into which the PNP base contact regions are to be formed, and having windows 123, 125 exposing surface portions of regions 72, 73 for collector contacts, and window 124 exposing a portion of P base region 97 between P+ base contact regions 117 and 118 and window 126 in capacitor region 26. Phosphorus is deposited on the exposed region surfaces, at a temperature of 950° C. for approximately 20 minutes via windows 121–126, followed by a diffusion treatment to drive in the deposited phosphorus. The diffusion treatment is carried out at 980° C., in an atmosphere of 10 minutes of oxygen, followed by 20 minutes of steam, followed by 15 minutes of nitrogen for an NPN HFE target of approximately 100 and $BV_{CEO}$ greater than 23 volts, thereby forming shallow N+ base contact regions 131, 132 on opposite sides of P emitter region 116 for the PNP transistor, and N emitter region 134 and N+ collector contact regions 133, 135 for the NPN transistor and region 136 for capacitor low resistivity bottom plate formation. While the NPN HFE is targeted at 100, with a sheet resistance of 15–20 ohms per square, the HFE value may lie in a range of from 80 to 130, with the diffusion temperature lying in a range of from 950°–1000° C. depending on control desired and the HFE target value. In the present example, the depth of each of regions 131–136 may be on the order of 0.8 $\mu$m or less. (Rather than form regions 131–136 by deposition and diffusion steps, the phosphorus ions may be implanted at 80 KeV at a dosage of $6 \times 10^{15}$ ions/cm$^2$, followed by the diffusion steps described above.)

After formation of the PNP and NPN transistors, the resulting thin oxide region 127 is removed to expose the surface of region 136. To define the parameters of the capacitor a thin oxide film 141 (on the order to 1,100 Å thickness) is formed over region 136, as shown in FIG. 8, by oxidizing the substrate at 850° C. in an atmosphere of oxygen for 5 minutes, followed by steam for 22 minutes, and finally nitrogen for ten minutes. When normal interconnect metal is employed for the top plate of the capacitor resulting 1,100 Å thickness of silicon dioxide produces a capacitance of 0.2 pf/mil$^2$. During the application of steam for 22 minutes, the capacitor oxide layer grows to a thickness on the order of 1,100 Å. The temperature and time can vary in a range of from 800°–900° C. for control purposes and thickness desired to maintain adequate voltage breakdown on the dielectric.

Next, apertures are etched in the overlying oxide to provide contact windows for the emitter, base and collector regions of the PNP and NPN devices and bottom plate of the capacitor. After etching the contact apertures, a thin film resistor comprising a resistive film such as a layer of nichrome 191 may be selectively deposited on field oxide 55 as shown. A typical thickness of nichrome resistor 191 is on the order of 100–200 angstroms.

Metallization consisting of silicon-doped aluminum (12–16K Å thickness) is then deposited on the substrate and selectively removed to leave contacts 151–158 for the PNP and NPN transistors and capacitor, the top plate 161 for the capacitor element and an interconnect to thin film resistor 191. By using phosphoric acid as an etchant the metallization is removed where desired but the remaining silicon is not etched. The residual silicon of the silicon-doped-aluminum metallization is not removed so as to not affect the characteristics of then film resistor 191. Upon completion of the formation of the metallization pattern, suitable sintering, passivation and backlap processing steps are carried out to complete the wafer.

As pointed out above, in accordance with the bipolar fabrication methodology of the present invention, both NPN and PNP vertical devices having their vertical base widths defined between the bottoms of very shallow emitter-base, base-collector junctions in reduced defect semiconductor material can be formed. For the materials and processing parameters of the foregoing exemplary device, the NPN transistor was measured to have a shallow base-collector junction depth of only approximately 1.03 μm and an emitter-base junction depth of approximately 0.88 μm. The sheet resistance of the base region is on the order of 350 ohms per square at an impurity concentration of $2 > 10^{18}/cm^3$, while the sheet resistance of the emitter region was measured to be on the order of 16 ohms per square at an impurity concentration of $3 \times 10^{20}/cm^3$ which falls within a desired range of 15–20 ohms per square for reduced emitter pipe leakage. The sheet resistance of the buried subcollector is on the order of 30 ohms per square. The N collector region itself (i.e. N region 24) has a resistivity on the order of 1.25 Ωcm at an impurity concentration of $4 \times 10^{15}/cm^3$.

Similarly, the PNP transistor was measured to have a shallow base-collector junction depth of only approximately 1.33 μm and an emitter-base junction depth of approximately 0.74 μm. The sheet resistance of the base region is on the order of 250 ohms per square at an impurity concentration of $2 \times 10^{18}/cm^3$, while the sheet resistance of the emitter region was measured to be on the order of 80 ohms per square at an impurity concentration of $6 \times 10^{19}/cm^3$. The P collector region itself (region 22) has an impurity concentration on the order of $5 \times 10^{16}/cm^3$.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed:

1. A semiconductor device comprising:
a semiconductor substrate containing dielectrically-isolated P and N conductivity regions;
a vertical PNP transistor formed in a dielectrically-isolated P conductivity region and including a P collector region corresponding to said dielectrically-isolated P conductivity region, an N base region formed in said P collector region, and defining a base-collector PN junction therewith, a P emitter region formed in said N base region and defining an emitter-base PN junction therewith, such that said vertical PNP transistor has a vertical base width defined between a portion of its base-collector PN junction containing a bottom portion of N base region and said P collector region and a portion of its emitter-base PN junction containing a bottom portion of said P emitter region and said N base region, and collector, base and emitter contacts respectively electrically coupled to said P collector region, said N base region and said P emitter region; and
a vertical NPN transistor formed in a dielectrically-isolated N conductivity region and including an N collector region corresponding to said dielectrically-isolated N conductivity region, a P base region formed in said N collector region, and said N emitter region formed in said P base region, such that said vertical NPN transistor has a vertical base width defined between a portion of its base-collector PN junction containing a bottom portion of said P base region and said N collector region and a portion of its emitter-base PN junction containing a bottom portion of said N emitter region and said P base region, and collector, base and emitter contacts respectively electrically coupled to said N collector region, said P base region and said P emitter region; and
wherein each of said vertical PNP and NPN transistors has a gain-bandwidth produce equal to at least one GHz.

2. A semiconductor device according to claim 1, wherein the base region of said PNP transistor is a shallow N base region formed in said P collector region thereof, said P emitter region of said PNP transistor is a shallow P emitter region formed in the N base region thereof and wherein said PNP transistor further includes N+ base contact regions disposed in said N bae region adjacent to opposite sides of said P emitter region, and respective P+ collector contact regions disposed in said P collector region adjacent to opposite sides of said N base region.

3. A semiconductor device according to claim 2, wherein the sheet resistance of said N base region is on the order of 250 ohms per square.

4. A semiconductor device according to claim 1, wherein the P base reion of said NPN transistor comprises a shallow P base region formed in said N collector region, the emitter region of said NPN transistor comprises a shallow N emitter formed in said P base region, and wherein said NPN transistor further comprises respective P+ base contact regions disposed in said P base region adjacent to opposite sides of said N emitter region, and respective N+ collector contact regions disposed in said N collector region adjacent to opposite sides of said P base region.

5. A semiconductor device according to claim 4, wherein the sheet resistance of said P base region is on the order of 350 ohms per square.

6. A semiconductor device according to claim 4, wherein the sheet resistance of said N emitter region is on the order of 15–20 ohms per square.

7. A semiconductor device according to claim 1, further including a thick field insulation layer disposed on the surface of said substrate between said P and N dielectrically isolated regions.

8. A semiconductor device according to claim 7, further comprising a thin film resistor formed on a portion of said thick field insulation layer.

9. A semiconductor device according to claim 1, further including a capacitor element formed of a thin insulator layer disposed on one of said dielectrically isolated regions having a high impurity concentration region disposed thereon and a conductive layer overlying said thin insulator layer.

10. A semiconductor device according to claim 9, further including interconnect metallization for said transistors, said thin film resistor and said capacitor element made of silicon doped aluminum.

* * * * *